United States Patent
Moreau et al.

(10) Patent No.: US 9,331,688 B2
(45) Date of Patent: May 3, 2016

(54) MODULAR ELECTRONIC DETECTION DEVICE

(75) Inventors: Katell Moreau, Paris (FR); Benoit Dantin, Epinay sur Seine (FR); Nicolas Chevassus, Chaville (FR)

(73) Assignee: AIRBUS GROUP SAS, Paris (FR)

( * ) Notice: Subject to any disclaimer, the term of this patent is extended or adjusted under 35 U.S.C. 154(b) by 0 days.

(21) Appl. No.: 14/112,104

(22) PCT Filed: Apr. 16, 2012

(86) PCT No.: PCT/EP2012/056929
§ 371 (c)(1),
(2), (4) Date: Oct. 17, 2013

(87) PCT Pub. No.: WO2012/146503
PCT Pub. Date: Nov. 1, 2012

(65) Prior Publication Data
US 2014/0049871 A1    Feb. 20, 2014

(30) Foreign Application Priority Data
Apr. 26, 2011 (FR) ....................... 11 53555

(51) Int. Cl.
H03K 17/51 (2006.01)
H01H 36/00 (2006.01)
H01H 13/10 (2006.01)
H01H 19/08 (2006.01)
H01H 23/24 (2006.01)
H01H 23/28 (2006.01)

(52) U.S. Cl.
CPC ............. *H03K 17/51* (2013.01); *H01H 36/006* (2013.01); *H01H 13/10* (2013.01); *H01H 19/08* (2013.01); *H01H 23/24* (2013.01); *H01H 23/28* (2013.01)

(58) Field of Classification Search
CPC ... H03K 17/51; H01H 36/004; H01H 36/006; H01H 13/10; H01H 19/08; H01H 23/28; H01H 23/24
See application file for complete search history.

(56) References Cited

U.S. PATENT DOCUMENTS 3,579,159 A * 5/1971 Posey ............................ 335/205
6,587,056 B1 * 7/2003 Fraser et al. .................. 340/945
7,856,158 B2 * 12/2010 Ballard ........................... 385/19
2009/0064809 A1    3/2009 Miret et al.

FOREIGN PATENT DOCUMENTS

EP    2031620 A2    3/2009
WO    2009111687 A2    9/2009

* cited by examiner

*Primary Examiner* — Zeev V Kitov
(74) *Attorney, Agent, or Firm* — IM IP Law PLLC; C. Andrew Im

(57) ABSTRACT

A modular electronic detection device comprises a mechanical actuator connected to a target through a front surface of a panel. The device further comprises a plurality of sensors for detecting the position of the target, which are connected to a printed circuit board. The modular detection device of the present invention can be incorporated into an aircraft and can be used in aircraft assembly.

19 Claims, 2 Drawing Sheets

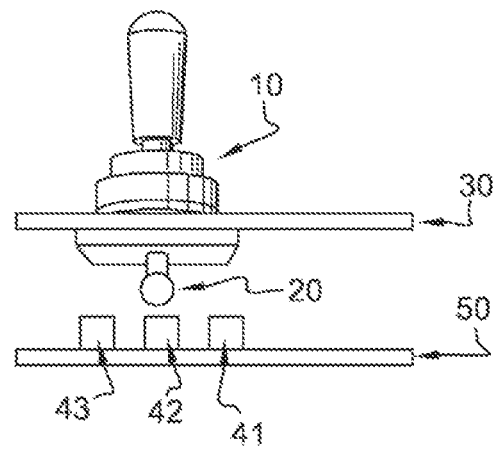
Fig. 1
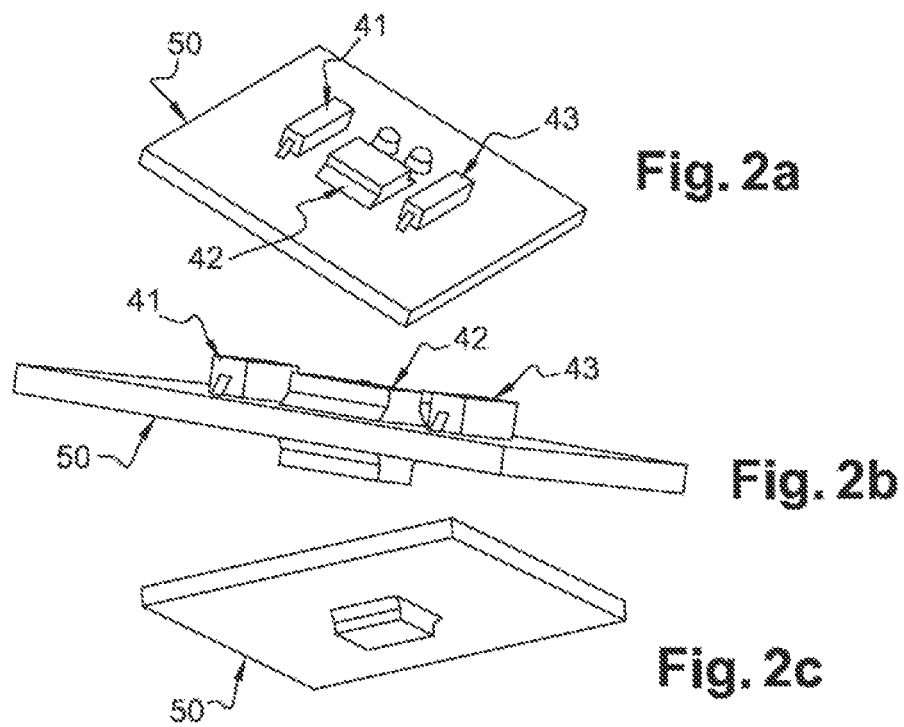
Fig. 2a
Fig. 2b
Fig. 2c

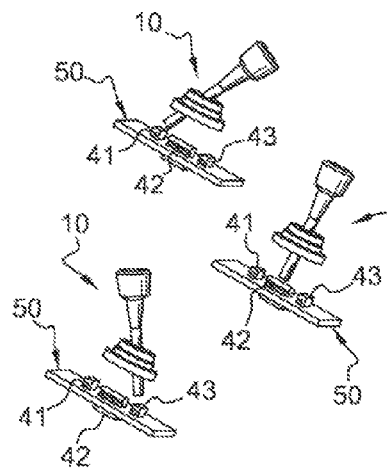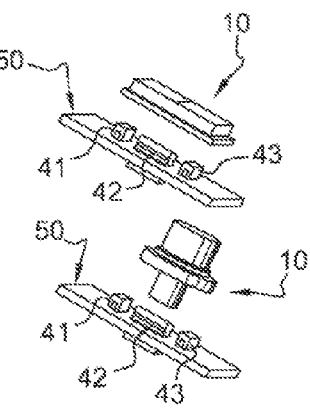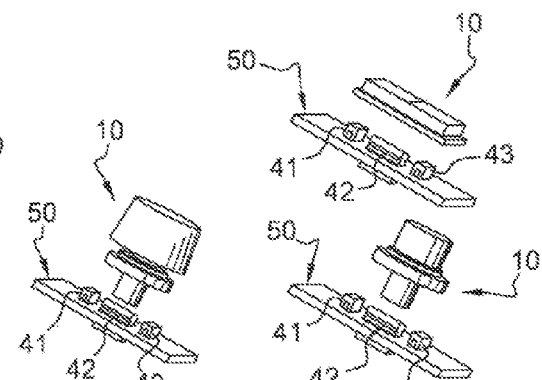
Fig. 3a    Fig. 3b    Fig. 3c
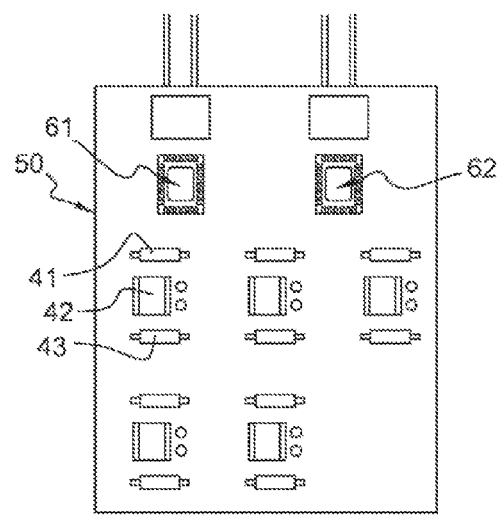
Fig. 4

MODULAR ELECTRONIC DETECTION DEVICE

RELATED APPLICATIONS

This application is a §371 application from PCT/EP2012/056929 filed Apr. 16, 2012, which claims priority from French Patent Application No. 11 53555 filed Apr. 26, 2011, each of which is herein incorporated by reference in its entirety.

FIELD OF THE INVENTION

The present invention relates to the field of electronics. More particularly, the present invention relates to a modular electronic detection device.

STATE OF THE ART

Installing electronic systems in aircraft is very time-consuming. Furthermore, such operations are part of the critical path of aircraft assembly.

The amount of cables makes for high mass, which has an impact on the performance of the aircraft.

Furthermore, expanding electrical systems locally increase the density of cables, especially in the cockpit zone and in the electronics area of the aircraft. This imposes major constraints in terms of space allocation, to the point that if all these cables are to be installed, the aerodynamics may be changed.

Finally, for the sake of greater flexibility and availability, users need to be able to reconfigure their aircraft dynamically between different missions and to minimize maintenance time.

At present, the control panels are mainly made up of rotary selectors, visual indicators, and switches connected wire-to-wire to the element they control. This kind of architecture accordingly necessitates a large number of cables.

Communications buses were introduced in aircraft some time ago, which has clearly reduced the number of cables involved.

However, even in recent airplanes or those still being developed, the critical signals are not multiplexed, because of the level of reliability required. The number of point-to-point communications elements remains high.

Finally, current solutions to the problem do not permit easy reconfiguration, because of the quantity of cables to be modified and because of the coupling of mechanical control and electrical commutation.

SUMMARY OF THE INVENTION

The object of the present invention is to overcome the disadvantages of the prior art by proposing an electronic detection device which is both modular and generic.

To that end, the present invention, in its most general sense, involves a modular, generic electronic detection device, characterized in that it comprises:
- a mechanical actuator linked to a target through a front face of a panel; and
- a plurality of position sensors of the target linked to a printed circuit board.

These sensors are always positioned in the same manner, regardless of the mechanical actuator chosen, which makes for generic, modular electronics.

The architecture chosen is always the same: the choice of components and their relative geographic positions.

Thus the device according to the present invention permits the following:
- by the modular electronics, shortening the time needed to reconfigure the aircraft;
- by the redundance and the architecture of the electronic components, shortening the time needed to locate breakdowns and perform maintenance;
- by multiplexing and the modularity, reducing the amount of cables and thus reducing the mass on board, shortening the installation time, and lessening the space allocated.

In one embodiment, the mechanical actuator is a pushbutton.

In one embodiment, the mechanical actuator is a rotary button: rotary selector or potentiometer.

In one embodiment, the mechanical actuator is a two-position switch button.

In one embodiment, the mechanical actuator is a three-position switch button.

In a variant, the position sensors are magnetic sensors.

In another variant, the position sensors are Hall sensors.

In still another variant, the position sensors are optical sensors.

The present invention also relates to an aircraft containing the aforementioned device.

The advantages of the device of the present invention are the following:
- the modularity of the detection (retroactive customization of the panel, fast reconfiguration of the panel);
- the generic nature of the detection device: it covers all functions;
- optimizing the height of the panel;
- multiplexing using simple electronics, making a sufficient level of reliability possible (lessening the amount of cables)
- device usable with any bus or protocol (CAN, Ethernet, etc.)
- contactless detection, making it possible to increase the number of uses of the device
- constant monitoring of the system status, because of the electronics installed;
- optimized cost.

BRIEF DESCRIPTION OF THE DRAWINGS

The invention will be better understood with the aid of the following description, which is purely for the sake of explanation, of one embodiment of the invention, in conjunction with the drawings, in which:

FIG. 1 is a basic diagram of the device according to the present invention;

FIGS. 2a, 2b and 2c show the device according to the present invention;

FIGS. 3a, 3b and 3c illustrate examples of uses of the device according to the present invention; and FIG. 4 shows an example of combining devices according to the invention to make up a panel.

DETAILED DESCRIPTION OF EMBODIMENTS OF THE INVENTION

FIG. 1 is a basic diagram of the device according to the present invention.

The modular, generic electronic detection device, shown in FIG. 1, comprises: a mechanical actuator 10 linked to a target 20 through a front face of a panel 30; and a plurality of position sensors 41, 42, 43 of the target 20 linked to a printed circuit board 50.

The principle thus proposed makes it possible, by a single modular electronic device, to physically decouple mechanical control and detection/information analysis; and detection and analysis of information from various types of mechanical actuators (pushbutton, rotary button, two- or three-position switch button, etc.).

The sensors can be installed on either side of a rigid, flexible, or flexible/rigid support for a printed circuit in a uniform manner (one mold per support) or combined manner (a plurality of molds per support.

Because of its size, this electronic device is easily integrated on a minimal surface area, which is compatible with the exigencies of aircraft control panels. This minimal surface area depends on the distance between two mechanical actuators (ergonomic rules).

To activate the detection device, a target solidly connected to the mechanical actuator portion is used.

To complete the modular electronics, the etching on the front face of the panel is also reconfigurable, so as to adapt to each function controlled by a switch or an optical sensor.

The sensors can be of varied technologies: magnetic, Hall-effect, optical, etc.

The provision according to the present invention can be assembled on a large scale and at low cost.

This provision makes it possible to reduce the cabling enormously, and thus to reduce the mass, shorten the installation time, and lessen the bulk of the panel (the panel height is reduced by a factor of 3).

With regard to the reconfigurable front face, the range of technologies that can be employed is wide: LCD, OLED, and PHOLED screens, and so forth.

FIGS. 2a, 2b and 2c show the device according to the present invention.

In each of FIGS. 2a-2c, position sensors 41, 42, 43 linked to a printed circuit board 50 are shown.

FIGS. 3a, 3b and 3c illustrate examples of uses of the device according to the present invention.

FIG. 3a shows a switch button with two and three positions.

FIG. 3b shows a potentiometer and rotary selector.

FIG. 3c shows two examples of pushbuttons.

In each of FIGS. 3a-3c, a mechanical actuator 10 and position sensors 41, 42, 43 linked to a printed circuit board 50 are shown.

FIG. 4 shows one example of combining devices according to the invention to make up a panel. In this example, there are two inputs and two communications ports, one level of protection ΔV communicating with each sensor, and five modular etchings, with each sensor supplied from two sources and communicating with both microcontrollers.

The present invention can be used for any control panels installed on board aircraft, especially for optional panels or panels dedicated to specific missions.

For functionality and availability that are equivalent to those of present panels, the device of the present invention makes it possible to achieve a reduction:
in the mass on board and the space allocated;
in the installation time;
in the time needed to locate a breakdown;
in maintenance time; and
in the time needed for reconfiguring the aircraft between two types of mission.

The invention has been described above by way of example. It is understood that one skilled in the art can also make various modifications in the invention without departing from the patent scope.

The invention claimed is:

1. A modular electronic detection device, comprising:
    a mechanical actuator mounted on a front face of a panel and linked to a target mounted on a back face of the panel;
    a plurality of position sensors of said target linked to a printed circuit board;
    wherein the mechanical actuator and the target are mechanically decoupled from said plurality of position sensors;
    wherein said mechanical actuator is a two-position switch button; and
    wherein the target is positioned between the panel and the printed circuit board.

2. The device of claim 1, wherein said mechanical actuator is a pushbutton.

3. The device of claim 1, wherein said mechanical actuator is a rotary button.

4. The device of claim 3, wherein said rotary button is a rotary selector or potentiometer.

5. The device of claim 1, wherein said position sensors are magnetic sensors.

6. The device of claim 1, wherein said position sensors are Hall sensors.

7. The device of claim 1, wherein said position sensors are optical sensors.

8. An aircraft comprising the device of claim 1.

9. The device of claim 1, further comprising a microcontroller to communicate with said plurality of sensors.

10. A modular electronic detection device, comprising:
    a mechanical actuator mounted on a front face of a panel and linked to a target mounted on a back face of the panel;
    a plurality of position sensors of said target linked to a printed circuit board;
    wherein the mechanical actuator and the target are mechanically decoupled from said plurality of position sensors;
    wherein said mechanical actuator is a three-position switch button; and
    wherein the target is positioned between the panel and the printed circuit board.

11. The device of claim 10, further comprising a microcontroller to communicate with said plurality of sensors.

12. The device of claim 10, wherein said mechanical actuator is a pushbutton.

13. The device of claim 10, wherein said mechanical actuator is a rotary button.

14. The device of claim 13, wherein said rotary button is a rotary selector or potentiometer.

15. The device of claim 10, wherein said position sensors are magnetic sensors.

16. The device of claim 10, wherein said position sensors are Hall sensors.

17. The device of claim 10, wherein said position sensors are optical sensors.

18. An aircraft comprising the device of claim 10.

19. The aircraft of claim 18, further comprising a microcontroller to communicate with said plurality of sensors.

* * * * *